(12) United States Patent
Caccia

(10) Patent No.: US 7,307,211 B1
(45) Date of Patent: Dec. 11, 2007

(54) SERVED BRAID LEAKAGE CURRENT DETECTING CABLE

(75) Inventor: Howard G. Caccia, Antioch, IL (US)

(73) Assignee: Coleman Cable, Inc., Waukegan, IL (US)

( * ) Notice: Subject to any disclaimer, the term of this patent is extended or adjusted under 35 U.S.C. 154(b) by 0 days.

(21) Appl. No.: 11/496,204

(22) Filed: Jul. 31, 2006

(51) Int. Cl.
*H01B 7/34* (2006.01)

(52) U.S. Cl. .................. 174/36; 174/74 R; 174/78

(58) Field of Classification Search .................. 174/36, 174/102 R, 108, 109
See application file for complete search history.

(56) References Cited

U.S. PATENT DOCUMENTS

| | | | | |
|---|---|---|---|---|
| 2,838,594 | A | * | 6/1958 | Dapelo ........................ 174/115 |
| 3,649,744 | A | * | 3/1972 | Coleman .................... 174/107 |
| 3,707,595 | A | * | 12/1972 | Plate ........................... 174/115 |
| 4,376,920 | A | | 3/1983 | Smith |
| 4,691,081 | A | | 9/1987 | Gupta et al. |
| 4,727,222 | A | * | 2/1988 | Sato ........................... 174/108 |
| 4,931,894 | A | | 6/1990 | Legatti |
| 5,101,161 | A | * | 3/1992 | Walsh et al. ................. 324/543 |
| 5,118,905 | A | * | 6/1992 | Harada ........................ 174/109 |
| 5,247,270 | A | * | 9/1993 | Harman et al. ............. 333/237 |
| 5,303,630 | A | | 4/1994 | Lawrence |
| 5,486,649 | A | | 1/1996 | Gareis |
| 5,530,364 | A | * | 6/1996 | Mashikian et al. ......... 324/529 |
| RE35,561 | E | * | 7/1997 | Mashikian et al. ......... 324/520 |
| 5,744,755 | A | | 4/1998 | Gasque, Jr. |
| 5,930,100 | A | | 7/1999 | Gasque, Jr. |
| 6,084,207 | A | | 7/2000 | Jones |
| 6,232,857 | B1 | | 5/2001 | Mason, Jr. et al. |
| 6,239,962 | B1 | | 5/2001 | Seymour et al. |
| 6,278,599 | B1 | | 8/2001 | Gasque, Jr. |
| 6,292,337 | B1 | | 9/2001 | Legatti et al. |
| 6,532,140 | B1 | * | 3/2003 | McMahon et al. ............ 361/54 |
| 6,534,999 | B2 | * | 3/2003 | Brown ........................ 324/543 |
| 6,577,236 | B2 | * | 6/2003 | Harman ...................... 340/552 |
| 6,633,001 | B2 | | 10/2003 | Gasque, Jr. |
| 6,639,769 | B2 | | 10/2003 | Neiger et al. |
| 6,815,617 | B1 | | 11/2004 | Gebs et al. |

(Continued)

FOREIGN PATENT DOCUMENTS

CA 2 503 933 A1 * 10/2005

(Continued)

OTHER PUBLICATIONS

"Cable 101: The basics of wire & cable", presentation, 32 pages, Copyright 1997, Belden Inc., http://bwcecom.belden.com/college/Cable101/Cable%20101%20Basics.pdf.

*Primary Examiner*—William H. Mayo, III
(74) *Attorney, Agent, or Firm*—Patzik, Frank & Samonty Ltd.

(57) ABSTRACT

An electrical cable for carrying a power signal and for detecting an arcing current or a leakage current within the cable. The electrical cable has a ground wire, a first conductor, a second conductor, and a first shield encasing the first conductor. The first shield has a plurality of threads laid in parallel and spiral wrapped around the first conductor. A lead is formed at an end of the first conductor from the plurality of threads wound about each other at the end of the first conductor. The lead is coupled to an arc current or a leakage detection circuit.

24 Claims, 2 Drawing Sheets

U.S. PATENT DOCUMENTS

| | | |
|---|---|---|
| 6,839,208 B2 | 1/2005 | Macbeth et al. |
| 6,850,394 B2 | 2/2005 | Kim |
| 6,999,289 B2 | 2/2006 | Macbeth et al. |
| 2002/0149891 A1* | 10/2002 | Neiger et al. .................. 361/42 |
| 2006/0146456 A1* | 7/2006 | Williams .................... 361/42 |

FOREIGN PATENT DOCUMENTS

| | | |
|---|---|---|
| JP | 04-084779 A * | 3/1992 |

* cited by examiner

SERVED BRAID LEAKAGE CURRENT DETECTING CABLE

FIELD OF THE INVENTION

The present invention relates generally to electrical cables for use in an electrical system in which a power circuit is opened in the event that an arcing current or leakage current in excess of a predetermined magnitude is detected, and more specifically to a lightweight, flexible electrical cable for use as an appliance cord or between lines of a house supply circuit, where the arcing current or leakage current in excess of a predetermined magnitude will trigger the power circuit into terminating the application of power across the cable.

BACKGROUND OF THE INVENTION

Electrical power cords and wires have been identified by the U.S. Consumer Products Safety Commission as a leading cause of electrical fires. Problems in home wiring, like arcing and sparking are associated with more than 40,000 home fires each year. Electrical fires kill over 750 people, injure 1400 victims and cause over $1 billion in property damage annually.

Electrical power cords and permanent electrical wiring can fail in a variety of ways, resulting in localized heating, arcing, and combustion of materials surrounding the cords and wires. The two types of faults that are responsible for the majority of wiring-related electrical fires are: (1) series faults; and (2) parallel faults. In a series fault, a connection in series with the load is broke, such as breakage of conductor within its insulator occurs. Arcing may occur along the gap created by the breakage, resulting in localized heating.

In a parallel fault, a conduction path is created between the two conductors of the cord or wire, or between the phase or hot conductor and ground (ground fault), or both. A parallel fault develops in three distinct stages: (1) leakage; (2) tracking; and (3) arcing. Leakage currents occur normally and safely in any cord set and are related to the capacitance and the resistance of the insulation encasing the leads of the cord. As long as the insulating layer is in good condition, small leakage currents are considered harmless and safe. In the second stage, as the insulating layer degrades over time or becomes damaged, a conductive path may develop over the insulating surface. This is known as "tracking" and may actually accelerate insulation degradation. During the third stage ("arcing") ionization of the air across the insulation gap occurs, providing a conduction path. The arc generates intense heat and can lead to combustion of surrounding materials. Degradation can also occur internally to the insulation medium due to excessive heat. Fire may start from either combustion of surrounding materials or the insulation itself, even in the absence of arcing.

A ground fault is type of parallel fault that is caused by leakage from a current-carrying conductor to ground, such as a short from the phase or hot conductor to the housing of an appliance. Even in the absence of arcing, if flammable material is present in or around the path to ground for leakage current, a fire hazard exists.

Leakage Current Protection Devices (LCPD) are a class of electrical or electromechanical devices for detecting leakage of current in an electrical circuit and include Ground Fault Interrupters (GFCI), Appliance Leakage Current Interrupters (ALCI), and Equipment Leakage Current Interrupters (ECLI). While GFCIs, APCIs, and ELCIs provide protection against shocks and fires by detecting arcing and faults to ground, these devices do not provide protection against across-the-line series and parallel arcing faults.

Arc fault and leakage current detection interrupters (AFCI/LCDI) protect against fires caused by arcing faults. In contrast to conventional circuit breakers that only respond to overloads and short circuits, AFCI/LCDIs are selective and protect against arcing conditions that produce erratic current flow. Normal arcing, i.e. from pulling a plug from a socket, power tool operation, or opening a switch, will not trigger an AFCI/LCDI. AFCI/LCDI circuitry continuously monitors flow through the circuit by utilizing current sensing circuitry to discriminate between normal and unwanted arcing conditions. The control circuitry trips internal contacts to de-energize the circuit when it detects an unwanted arcing condition.

What makes power supply cords used in connection with AFCI/LCDI circuits different from typical power supply cords is the following: (1) the hot and neutral conductors include a copper woven braid shield directly applied over the conductor insulation; and (2) the woven braid shield wire is coupled to an electrical circuit. The accepted standard for these types of power supply cords (UL Standard 758, Section 2) specifies a copper braid with an 85% minimum coverage applied directly over the conductor insulation. The fault detection device is coupled to the woven braid shield typically by solder termination. In this arrangement, the woven braid shield creates a circuit that can detect minute amounts of electrical current.

The typical function of the woven braid shield is to create the Faraday cage effect, which is useful in shielding against RFI and EMFI interference (radio frequency interference and electro magnetic frequency interference). The woven braid is used in conjunction with a foil tape for low and high frequency shielding effectiveness. Coaxial cable applications terminate the woven braid wire at the connector and control cables typically rely on a drain wire in conjunction with, and in contact with a foil shield, where the drain wire is used to "ground the circuit." Both of these applications utilize a foil shield which provides 100% coverage and at the same time the foil helps to disperse the pressure applied by the braid wires not allowing them to impact the insulation thickness. The amount and volume of copper braid wire can be specified electrically by specifying a DCR (direct current resistance) value for the shield.

FIGS. 1 and 2 show an electrical cable 10 having conductors 12, 14 encased in woven-braid shields 16, 18. Each woven-braid shield 16, 18 is created through a typical braiding method where multiple bobbins (each with multiple ends) are placed on a braiding machine that passes one group of bobbin wires over the other in rapid succession—the top and bottom carriers of the braider move in opposite directions and deflector plates create the weave. The wires on each bobbin are under tension to maintain the weave, the tension is necessary to "close" the weave tight to the core. This tension is also necessary to allow the braid shield to maintain its position during subsequent processing. The combination of the bobbin wire tension and wire surface contact, braid wire "layer over layer", allow the inside braid wires to penetrate or indent the conductor insulation surface. The "layer over layer" condition also creates shield redundancy, where strands cross each other or overlap that provides no additional shield detection or circuit capabilities.

In a power supply cord for appliances such as window air conditioners, use of relatively soft insulation material is desirable to improve product flexibility, i.e. the way the power supply cord "hangs" and handles after installation. The softness of the insulation creates an opportunity for the woven braid wire to significantly deform (in the range of 2-3%) the insulation material from wire tension and minimal point to point layer contact. This ultimately reduces the dielectric strength and electrical insulation properties of the insulation materials. The use of a woven braid wire exhibits a number of other drawbacks, including, but not limited to: (1) power supply cord weight and diameter, (2) difficulty of manufacture as a result of tensioning requirements during creation of the woven braid; and (3) complicated circuit termination as a result of the number and orientation of strands in the woven braid wire (as is seen in FIG. 2).

Accordingly, it is one object of the present invention to provide a power supply cord for use as part of an AFCI/LCDI circuit to detect conductor insulation breakdown, rupture or damage either between conductors or to an individual conductor, i.e. through the jacket and insulation, which addresses the drawbacks of currently available power supply cords.

SUMMARY OF THE INVENTION

The present invention relates to an electrical cable for carrying a power signal and for detecting an arcing current or a leakage current within the cable, the electrical cable comprising: a ground wire, a first conductor, and a second conductor; a first shield encasing the first conductor, the first shield comprising a plurality of threads laid in parallel and spiral wrapped around the first conductor; and a lead formed at an end of the first conductor, the lead comprised of the plurality of threads wound about each other at the end of the first conductor. The lead is coupled to an arc current or a leakage detection circuit. The spiral wrapped portion of the first shield covers at least 85% of the surface area of the first conductor.

The electrical cable further comprises a second shield encasing the second conductor, the second shield comprising a plurality of threads laid parallel and spiral wrapped around the second conductor. The lead is comprised of the plurality of threads of the first shield and the plurality of threads of the second shield wound around each other.

DETAILED DESCRIPTION OF DRAWINGS

Figure 1:
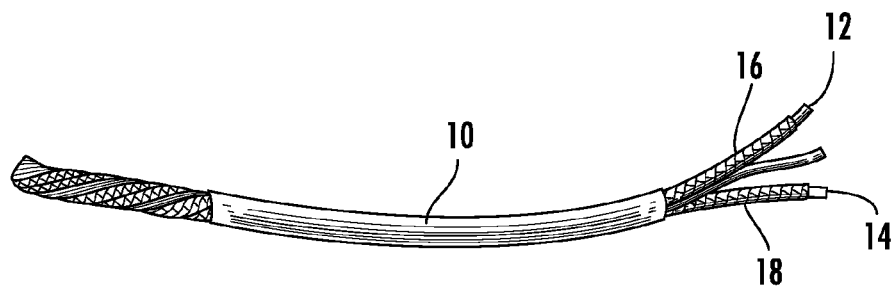
FIG. 1 shows a first elevation view of a prior art woven braid shield power supply cord.
Figure 2:
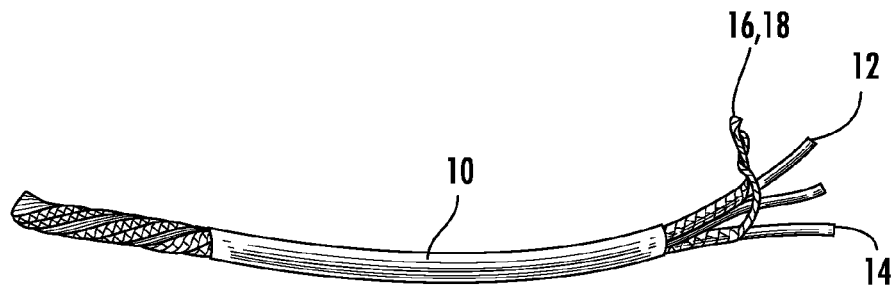
FIG. 2 shows a second elevation view of a prior art woven braid shield power supply cord.
Figure 3:
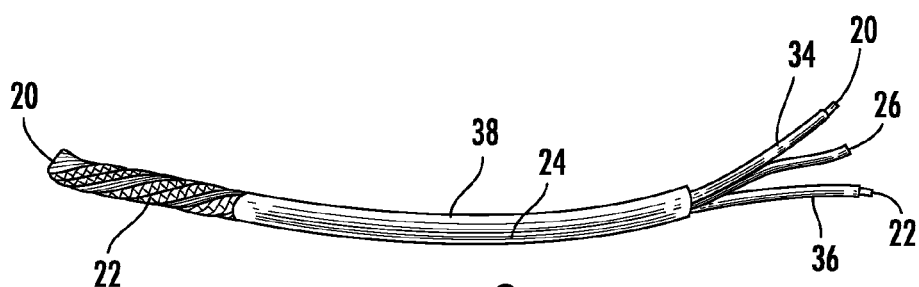
FIG. 3 shows a first elevation view of a served braid shield power supply cord in accordance with a preferred embodiment of the present invention.
Figure 4:
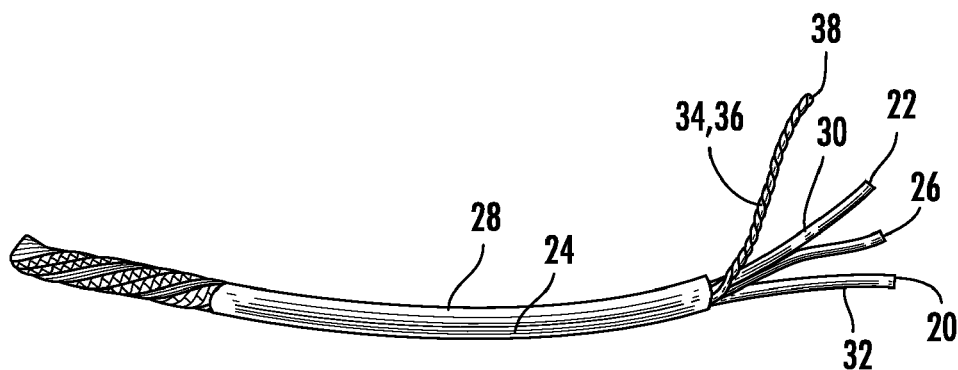
FIG. 4 shows a second elevation view of a served braid shield power supply cord in accordance with a preferred embodiment of the present invention.
Figure 5:
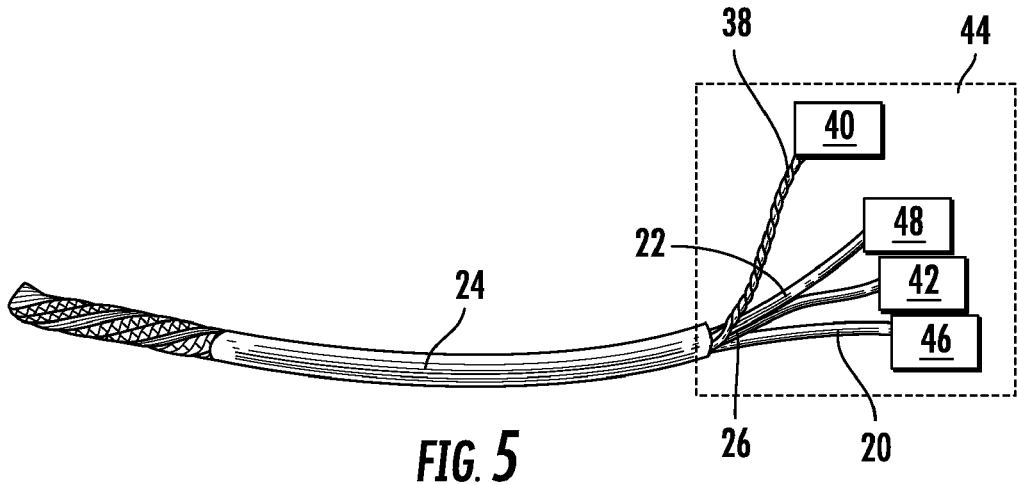
FIG. 5 shows a third elevation view of a served braid shield power supply cord in accordance with a preferred embodiment of the present invention coupled to an AFCI/LCDI device.

FIGS. 3-5 showed a preferred embodiment of the present invention in which a plurality of threads of braid wire is applied directly over the conductors 20, 22 of the power supply cable 24 in a spiral or "served" manner. Instead of utilizing alternating bobbins to created a weave, as described with respect to the prior art above, a single carrier or track is utilized that rotates in a single direction. The resulting shield has a single layer applied in a single direction or spiral, where all of the plurality of threads used to create the shield are laid parallel to each other.

Referring to FIG. 3, the first end of the cable 24 shows the ground wire 26, and the first and second conductors 20, 22 spiral wound together and extending from the jacket 28. The second end of the cable 24 shows the ground wire 26, and the first and second conductors 20, 22 unwound from each other. The conductors 20, 22 are both encased first in an insulation layer 30, 32 and then by a served-braid, spiral shield 34, 36 in accordance with the present invention. In FIG. 4, the served-braid, spiral shields 34, 36 are shown unwound from the conductors 20, 22, with the plurality of threads comprising the shields 34, 36 wound together to form a single lead 38. In FIG. 5, the lead 38 is shown connected to AFCI/GFCI circuitry 40, the ground wire 26 is coupled to the ground lead 42 of the plug 44, and the first and second conductors 20, 22 are coupled to the "hot" 46 and neutral 48 leads of the plug 44.

In the first preferred embodiment of the present invention shown in FIGS. 3-5, the first and second conductors 20, 22 and the ground wire 26 are comprised of 14 AWG bare copper wire. In another preferred embodiment of the present invention, the first and second conductors 20, 22 and the ground wire 26 are comprise of 10 AWG bare copper wire. The insulation layers 30, 32 are comprised of poly-vinyl chloride (PVC) commonly used for electrical applications. The plurality of threads comprising the served-braid, spiral shields 34, 36 are preferably composed from 34 AWG CCA copper wire. The served-braid, spiral shields 34, 36 are wound for at least 85% coverage of the conductors 20, 22. Because the shields 34, 36 are not being applied for electrical shielding characteristics (the DCR value of the braid and the EMFI/RFI shielding effectiveness is inconsequential) but rather to complete an electrical circuit, 100% coverage of the conductors 20, 22 is not required.

Use of the served-braid, spiral shields 36, 38 offers several noticeable advantages over the prior art. These advantages include: (1) the finished cable 16 is measurably more flexible and exhibits a smoother finish or surface (reduced convolutions or jacket depressions); (2) the finished diameter of the cable 16 has a smaller/minimized profile; (3) the amount of braid wire used by weight is reduced (by approximately 36%); (4) shielding or circuit conductor redundancy is eliminated; (5) the total product weight is reduced by approximately 10%; (6) the individual threads of the served braids, spiral shields can be applied with very little tension because there is no weave to close which significantly reduces insulation deformation and protects the dielectric integrity or strength of the material; (7) the circuit termination is easier/faster to achieve and more effective because the served braid threads are easily organized into a single group—the cable termination only includes a few inches of conductor exposed); and (8) lower risk of damaging or missing strands and or conductor insulation during circuit termination.

An application of the present inventive electrical cable 24 has been described in a manner that is exemplary in nature. It will be understood that modifications and variations may be effected without departing from the spirit and scope of the present invention. It will be appreciated that the present disclosure is intended as an exemplification of the invention and is not intended to limit the invention to the specific embodiments illustrated and described. The disclosure is intended to cover, by the appended claims, all such modifications as fall within the scope of the claims.

I claim:

1. An apparatus for carrying a power signal and for detecting an electrical fault condition within an electrical cable, the apparatus comprising:
   a ground wire, a first conductor, and a second conductor;
   a first shield encasing the first conductor, the first shield comprising a plurality of threads laid in parallel and spiral wrapped around the first conductor; and
   a lead formed at an end of the first conductor and coupled to an electrical fault detection circuit, the lead comprised of the plurality of threads wound about each other at the end of the first conductor.

2. The apparatus of claim 1 wherein the spiral wrapped portion of the first shield covers at least 85% of the surface area of the first conductor.

3. The apparatus of claim 1 wherein the plurality of threads of the first shield are electrically conductive.

4. The apparatus of claim 1 further comprising a second shield encasing the second conductor, the second shield comprising a plurality of threads laid parallel and spiral wrapped around the second conductor, and wherein the lead is comprised of the plurality of threads of the first shield and the plurality of threads of the second shield wound around each other.

5. The apparatus of claim 1 wherein the electrical fault detection circuit comprises a leakage current detector.

6. The apparatus of claim 1 wherein the electrical fault detection circuit comprises an arc fault detector.

7. The apparatus of claim 1, wherein the apparatus further comprises an electrical circuit interrupter coupled to the electrical fault detection circuit.

8. A method of detecting an electrical fault condition in an electrical cable, the method comprising:
   providing a ground wire, a first conductor, and a second conductor;
   encasing the first conductor in a first shield, the first shield comprising a plurality of threads laid parallel to each other and spiral wrapped around the first conductor;
   forming a lead by winding the plurality of threads of the first shield at an end of the first conductor; and
   coupling the lead to an electrical fault detection circuit.

9. The method of claim 8 further comprising:
   encasing the second conductor in a second shield, the second shield comprising a plurality of threads laid parallel to one another and spiral wound around the second conductor; and
   forming the lead by winding the plurality of leads of the first shield and the second shield together at corresponding ends of the first and the second conductors.

10. The method of claim 8 wherein the step of coupling the lead to an electrical fault detection circuit comprises the step of coupling the lead to a leakage current detector.

11. The method of claim 8 wherein the step of coupling the lead to an electrical fault detection circuit comprises the step of coupling the lead to an arc fault detector.

12. The method of claim 8, further comprising the step of coupling the electrical fault detection circuit to an electrical circuit interrupter.

13. An apparatus for carrying a power signal and for detecting an electrical fault condition, the apparatus comprising:
   a ground wire, and at least a first conductor;
   a first shield encasing the first conductor, the first shield comprising a plurality of threads laid parallel to one another and spiral wound around the first conductor; and
   an electrical fault detection circuit coupled to at least a portion of the first shield.

14. The apparatus of claim 13 wherein the plurality of threads are electrically conductive.

15. The apparatus of claim 13 further comprising a lead formed by winding the plurality of threads about one another, the lead configured to be connected to the electrical fault detection circuit.

16. The apparatus of claim 15 wherein the first shield cover at least 85% of the first conductor.

17. The apparatus of claim 13 wherein the plurality of threads of the first shield are electrically conductive.

18. The apparatus of claim 17 wherein the plurality of threads of the second shield are electrically conductive.

19. The apparatus of claim 13 further comprising a second shield encasing the second conductor, the second shield comprising a plurality of threads laid parallel to one another and spiral wound around the second conductor.

20. The apparatus of claim 19 wherein the second shield covers at least 85% of the second conductor.

21. The apparatus of claim 19 further comprising a lead formed by winding the plurality of threads of the first and the second shields about one another.

22. The apparatus of claim 13 wherein the electrical fault detection circuit comprises a leakage current detector.

23. The apparatus of claim 13 wherein the electrical fault detection circuit comprises an arc fault detector.

24. The apparatus of claim 13 wherein the apparatus further comprises an electrical circuit interrupter coupled to the electrical fault detection circuit.

* * * * *